United States Patent [19]

Earl et al.

[11] Patent Number: 5,517,582
[45] Date of Patent: May 14, 1996

[54] METHOD AND APPARATUS FOR INCREASING INFORMATION COMPRESSIBILITY

[76] Inventors: Joseph G. Earl, 5100 Covington St., Greenwood; Michael D. Moffitt, 5570 Covington Rd., Shorewood, both of Minn. 55331

[21] Appl. No.: 291,872

[22] Filed: Aug. 17, 1994

Related U.S. Application Data

[62] Division of Ser. No. 730,268, Jul. 12, 1991, Pat. No. 5,341,440.

[51] Int. Cl.⁶ ................................................. G06K 9/36
[52] U.S. Cl. ............................... 382/233; 348/384
[58] Field of Search ............... 382/56, 233, 232; 358/430, 432, 433; 341/67, 107; 348/384, 390, 399, 400; H04N 1/41

[56] References Cited

U.S. PATENT DOCUMENTS 4,652,935  3/1987  Endoh et al. ............................ 382/56
4,920,426  4/1990  Hatori et al. ........................... 358/430
5,172,237  12/1992  Blondstein et al. ..................... 382/56
5,341,440  8/1994  Earl et al. ............................. 382/233

*Primary Examiner*—Joseph Mancuso
*Attorney, Agent, or Firm*—Robert A. Brown

[57] ABSTRACT

A system for compressing information arranges unprocessed information into a plurality of data planes. The data planes are converted into a combined planar data output. The combined planar data output is created by regrouping data elements which make up the unprocessed information. The regrouping is such that the entropy of the unprocessed information is increased. This provides increased compressibility of the data. The combined planar data output is compressed using standard information compression techniques. Data is reconstructed by uncompressing compressed data and rearranging it into its original format.

8 Claims, 5 Drawing Sheets

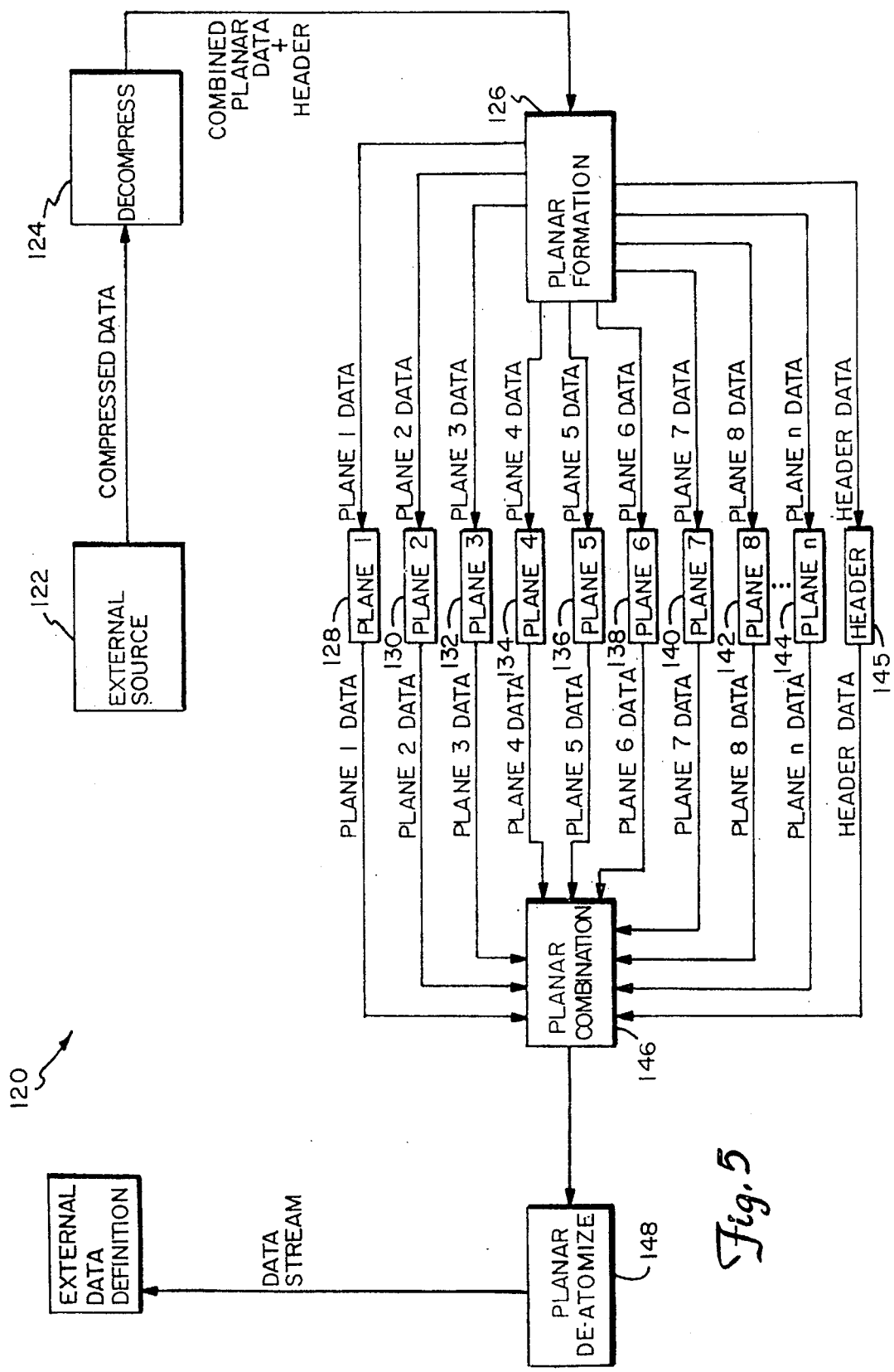

METHOD AND APPARATUS FOR INCREASING INFORMATION COMPRESSIBILITY

This is a division of application Ser. No. 07/730,268, filed Jul. 12, 1991, now U.S. Pat. No. 5,341,440.

BACKGROUND OF THE INVENTION

The present invention relates to information compression. In particular, the present invention relates to increasing the compressibility of the information.

Information compression systems are used to compress information and thereby decrease storage requirements, Additionally, compressed information can be transferred more rapidly between physical locations than uncompressed information. Maintaining information in a compressed format decreases hardware requirements in communication and .information systems.

Information compression may be achieved using a number of different techniques. For example, information compression can be accomplished by recognizing recurring patterns in the information. A dictionary is created based upon the recurring patterns. The dictionary contains a list of tokens, each of which corresponds to one of the recurring patterns. Using this technique of information compression, compressed information takes the form of a string of tokens along with an appropriate dictionary which contains definitions of each token.

The efficiency of information compression systems is limited by the form of the information. For example, if a stream of information appears highly chaotic, an information compression system will have only limited success in compressing the information stream. On the other hand, an information stream which is highly ordered can be greatly compressed. Typically, information is treated as a linear stream of data, without regard to increasing the level of order of the information. This is probably due to the linear nature of information storage and transmission systems presently employed. A data stream can be interpreted in two dimensions such as, for example, a bit mapped image. However, when compressing two-dimensional data, the traditional perspective is to "read" documents or images from top to bottom and left to right and thereby convert them into a linear format.

An improved information compression system which provides increased data compression would be a significant contribution to the art.

SUMMARY OF THE INVENTION

The present invention provides increased data compression by increasing information compressibility. Increased information compressibility is achieved by reformatting the information in a way which causes the information to be more highly ordered. Information is acquired from an information source. In accordance with the present invention, information is organized into a plurality of data planes. Each data plane includes a plurality of data elements (such as bytes, nibbles, or bits) organized in a two dimensional array. The data planes are disassembled into a combined planar data stream by a planar combination process which selects a series of adjacent data elements along a path through the plurality of data planes. This creates the combined planar data stream of information. A block of data is attached to the data stream which carries information regarding how the combined planar data stream relates to the original information stream, so that the original information can be reconstructed. The combined planar data stream is provided to an information compression system. The information compression system compresses the information.

Conversion of the data planes into a combined planar data stream may be through a predefined rearrangement of the data elements. Alternatively, means for calculating "entropy" (i.e. the level of organization of data) can be used to determine a rearrangement which will yield a more organized data stream.

The present invention includes an information source for providing a stream of unprocessed information. A planar atomize means reduces the stream of unprocessed information into component elements. A planar formation means arranges component elements of the stream of unprocessed information into a plurality of data planes. A planar combination means converts the plurality of data planes into a combined planar data stream having a length. A data compression means receives the combined planar data stream, reduces its length, and provides a compressed information stream output.

BRIEF DESCRIPTION OF THE DRAWINGS

FIG. 5 is a block diagram of an information processing system which expands compressed information, in accordance with the present invention.

DETAILED DESCRIPTION OF THE PREFERRED EMBODIMENTS

Figure 1:
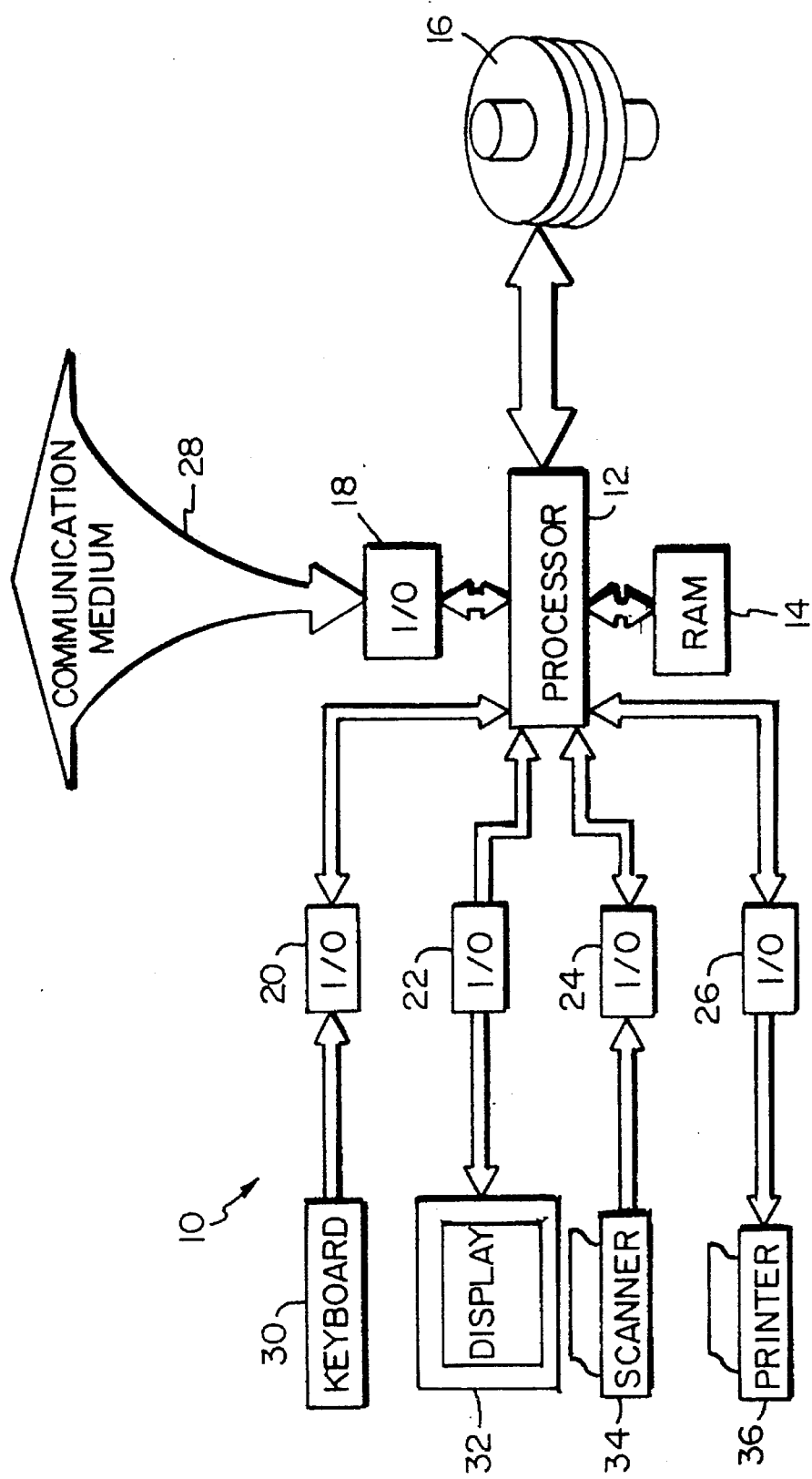
FIG. 1 is a block diagram of an information compression system in accordance with the present invention.

FIG. 1 is a block diagram of an information compression system 10 in accordance with the present invention. Information compression system 10 includes a processor 12 which comprises, for example, a microprocessor. Processor 12 is coupled Random Access Memory (RAM) 14 and permanent storage device 16. Permanent storage device 16 comprises, for example, a magnetic disc drive. Processor 12 is also connected to input/output (I/O) ports 18, 20, 22, 24 and 26. I/O ports 18 through 26 comprise serial and parallel ports and display drivers. I/O port 18 is coupled to a communications medium 28. Communications medium 28 comprises, for example, a telephone line or a computer network interface. I/O port 20 couples to a keyboard 30. I/O port 22 is connected a display 32. Display 32 can also display compressed images. I/O port 24 is connected to an optical scanner 34 and I/O port 26 is connected to a printer 36.

In operation of system 10, processor 12 performs program instructions which are stored in RAM 14, in permanent storage device 16 or received over communication medium 28. An operator can control operation of processor 12 through keyboard 30. Processor 12 displays information relating to system 10 on display 32. Scanner 32 provides a means of inputting images into processor 12. Processor 12 can produce a hard copy on printer 36 through I/O port 26.

In the present invention, data elements in a linear data stream are reformatted into a plurality of data planes. As most storage devices (such as RAM 14 or permanent storage medium 16) require a linear data format, creating a data plane requires the use of pointers which define edges of the data plane and format the data into an array. Therefore, even though the information is actually stored linearly, multi-dimensional data formats can be created using data manipulation techniques.

Figure 2:
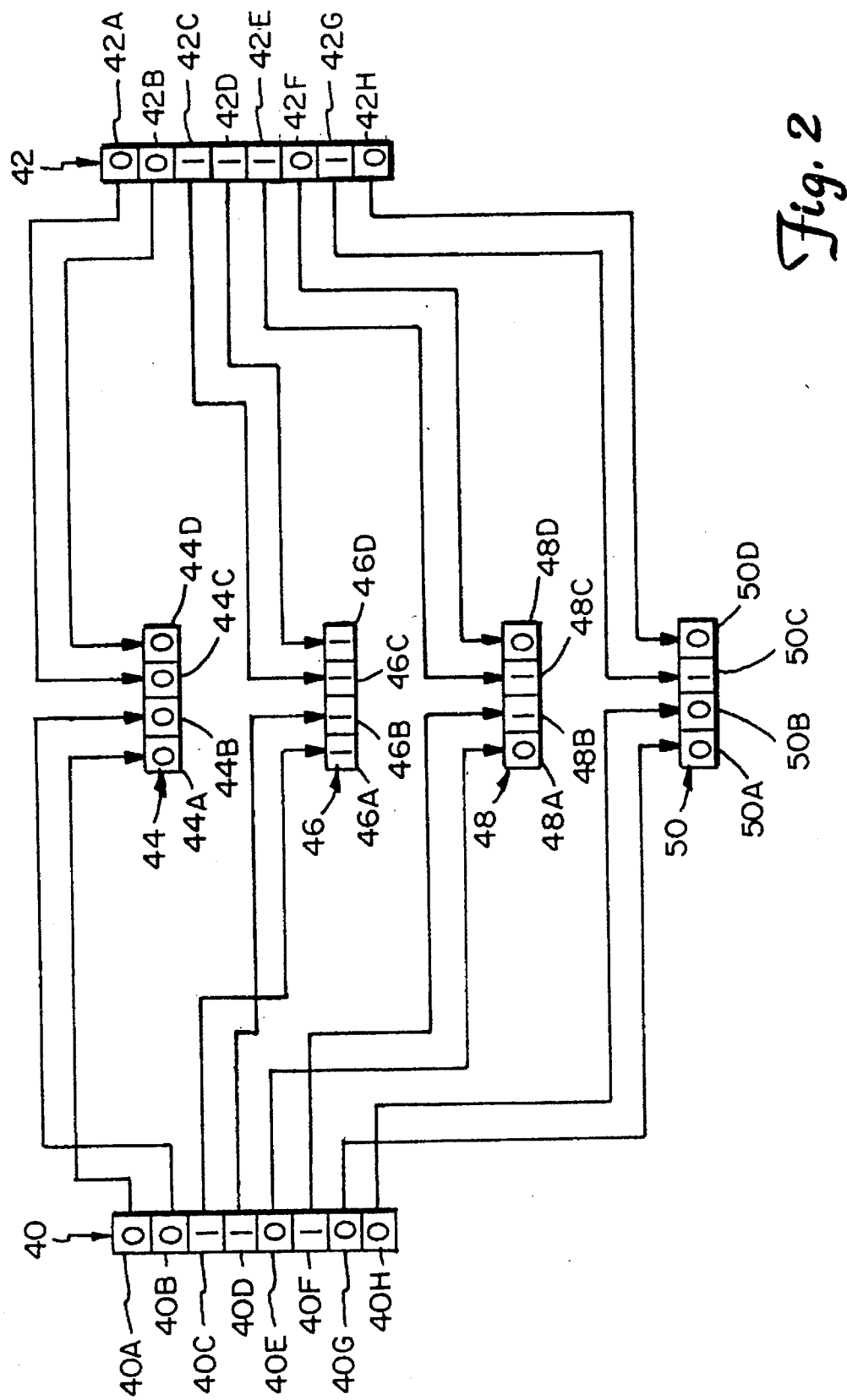
FIG. 2 shows a technique in which bytes are reformatted into four data planes.

FIG. 2 shows a planar formation technique in which bytes are formatted into four data planes, in accordance with the present invention. In FIG. 2, a first byte 40 and a second byte 42 are reformatted into four data planes. Bytes 40 and 42 are part of a block of data which is reformatted for subsequent compression. Bytes 40 and 42 are part of a much longer block of information. However, for this description only two bytes are shown. Additional bytes are treated in a similar manner. In the example of FIG. 2, bytes 40 and 42 are 8 bits in length and are reformatted into four nibbles 44, 46, 48, and 50. Arrows in FIG. 2 indicate how individual bits from bytes 40 and 42 are rearranged into different bit locations of nibbles 44 through 50 to achieve four data planes. As shown in FIG. 2, bits from byte 40 are placed in the first two bit locations of nibbles 44, 46, 48, and 50. Bits 40A and 40B are transferred to bit locations 44A and 44B of nibble 44. Similarly, bits 42A and 42B of byte 42 are transferred to bit locations 44C and 44D of nibble 44. This process is the same for the remaining bits 40C through 40H of byte 40 and 42C through 42H of byte 42.

Figure 3:
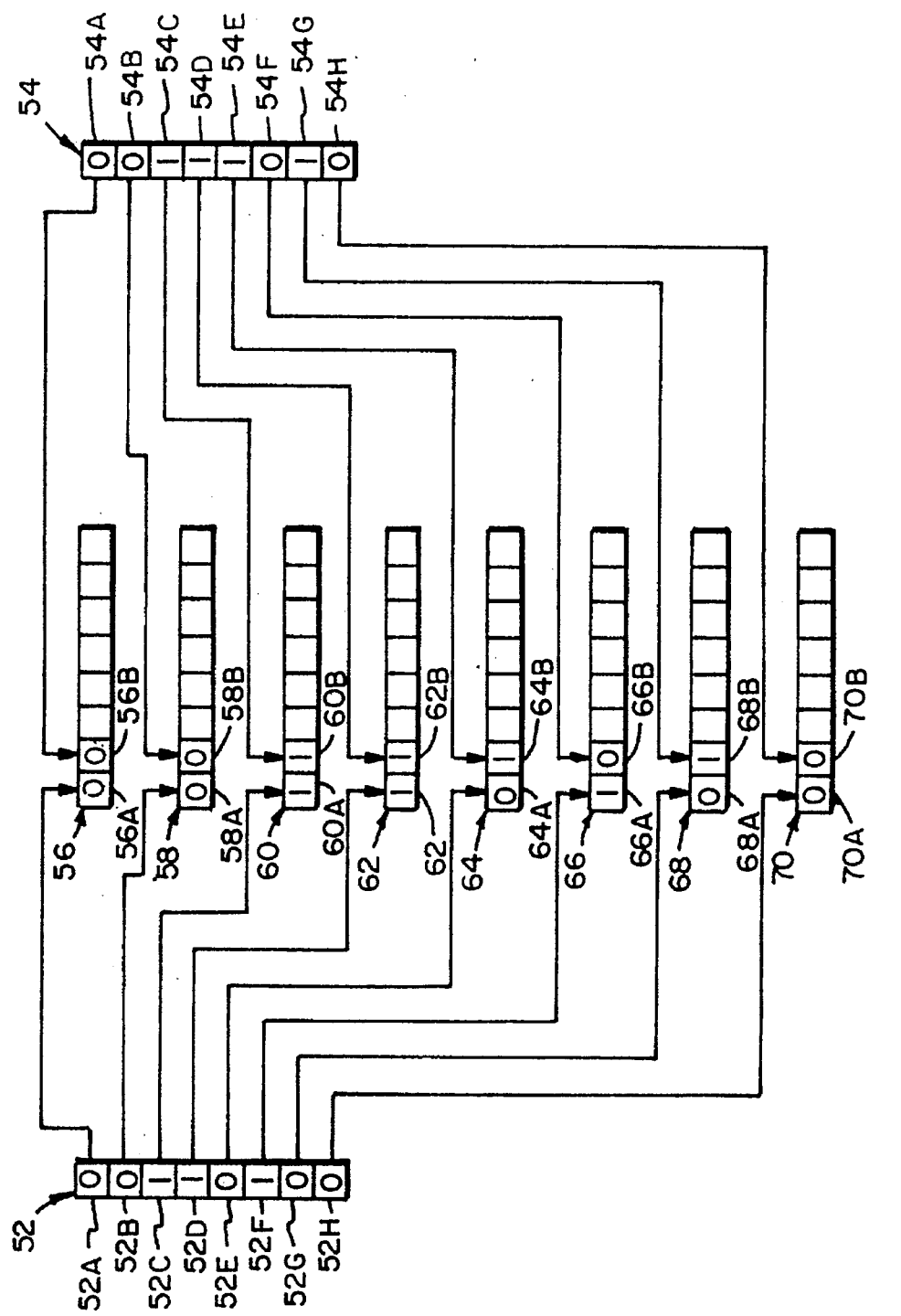
FIG. 3 shows a technique in which bytes are reformatted into eight data planes.

FIG. 3 shows conversion of a first byte 52 and a second byte 54 into eight data planes 56, 58, 60, 62, 64, 66, 68, and 70. As with the example of FIG. 2, bytes 52 and 54 are part of a much larger block of data. If more than two unprocessed bytes, 52 and 54, were shown in the example, each plane 56–70 would be shown to contain eight bits. In the example of FIG. 3, each plane 56 through 70 includes a single bit from one of the incoming unprocessed bytes 52 and 54.

Figure 4:
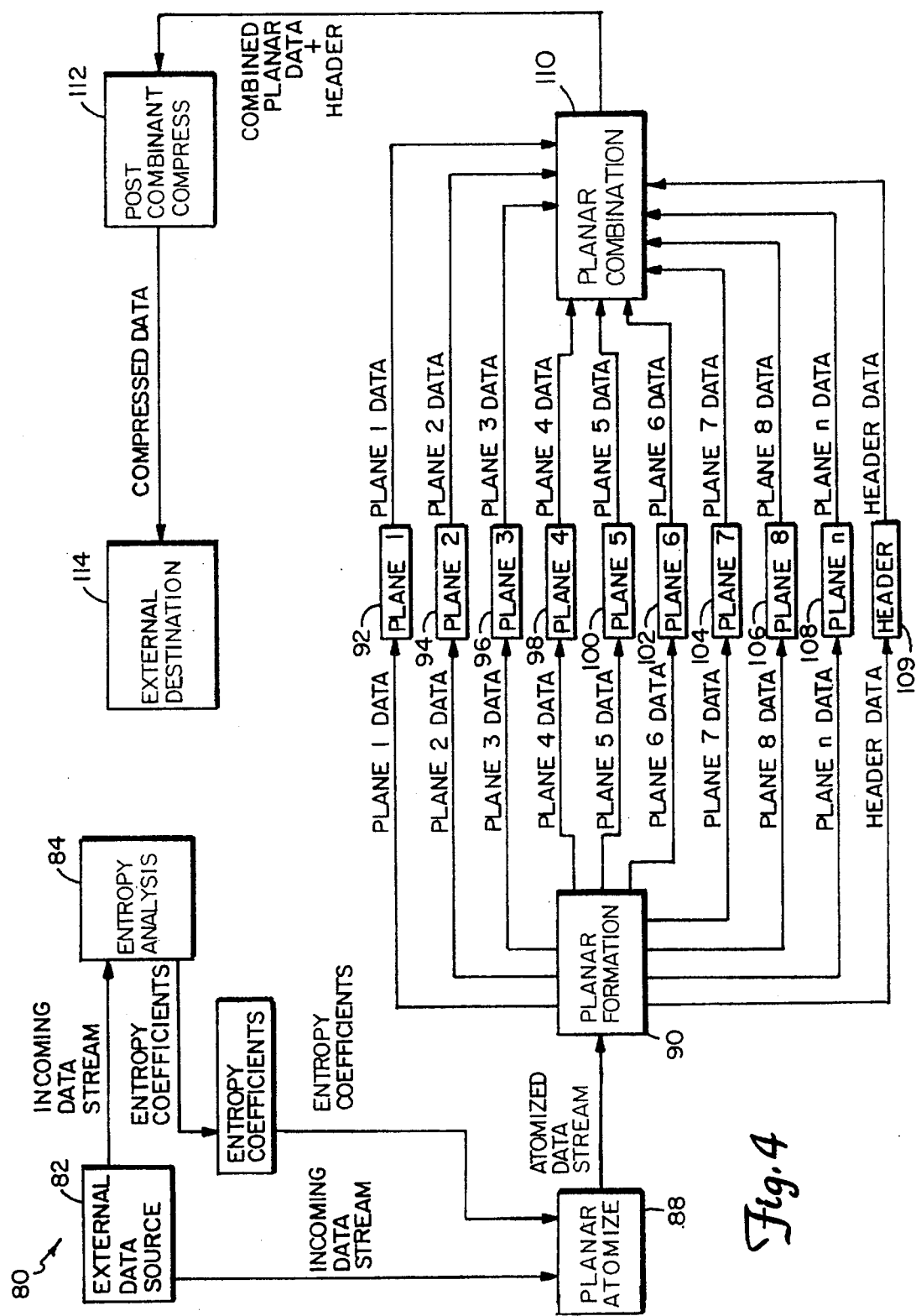
FIG. 4 is a block diagram of an information preprocessing system which increases information compressibility, in accordance with the present invention.

FIG. 4 shows a block diagram of a data compression system 80 in accordance with the present invention. In FIG. 4, an external data source 82 provides a source of information to be compressed. External data source 82 may comprise, for example, permanent storage device 16, communication medium 28, or scanner 34 shown in FIG. 1.

System 80 includes an entropy analysis block 84 coupled to external data source 82. Entropy analysis block 84 is coupled to an entropy coefficient register 86. Entropy coefficient register 86 is also coupled to a planar atomize block 88. Planar atomize block 88 is connected to external data source 82. An output from planar atomize block 88 is provided to a planar formation block 90. Planar formation block 90 is coupled to a Plane 1 register 92, a Plane 2 register 94, a Plane 3 register 96, a Plane 4 register 98, a Plane 5 register 100, a Plane 6 register 102, a Plane 7 register 104, a Plane 8 register 106, and a Plane n register 108. A header register 109 is connected to planar formation block 88. Registers 92 through 109 are coupled to a planar combination block 110. An output from planar combination block 110 is provided to a post combination compress block 112. A compressed data output from post combinant compress block 112 is provided to external data destination 114. External data destination 114 may comprise, for -example, permanent storage medium 16, communication medium 28, display 32, printer 36, or RAM 14 shown in FIG. 1. In system 80 of FIG. 4, planar atomize block 88, planar formation block 90, registers 92 through 109, and planar combination block 110 form a data resequencer for rearranging the order of a data stream.

The data resequencer formed by planar atomize block 88, planar formation block 90, registers 92 through 109, and planar combination block 110 rearranges the order of the incoming data stream and provides the combined planar data output to post combinant compress block 112. The data reshuffling rearranges the order of data to increase pattern repetition and thereby increase the efficiency of post combinant compress block 112. The rearrangements can be predefined or can be based upon information from entropy analysis block 84.

In operation, external data source 82 provides an unprocessed data stream to be compressed and eventually provided to external data destination 114. External data source 82 provides an incoming data stream of unprocessed information to entropy analysis block 84 and planar atomize block 88. Entropy analysis block 84 calculates entropy coefficients of the unprocessed data stream and stores the entropy coefficients in entropy coefficient register 86. Entropy analysis block 84 performs a matrix manipulation-on the incoming data stream. For example, in a preferred embodiment of the present invention, entropy analysis block 84 performs a linear matrix transformation on the data stream. In one embodiment, entropy analysis block 84 rotates the matrix three times through 90°, 180°, and 270°. Entropy is calculated for each of these orientations (along with 0°, i.e. no rotation) to determine which will yield the most efficient compression. Additionally, entropy analysis block 84 can perform any type of matrix transformation and may be optimized for certain types of data.

Planar atomize block 88 accesses entropy coefficients stored in entropy coefficient register 86. Planar atomize block 88 "atomizes" or breaks down the incoming data stream into component elements, which are provided to planar formation block 90. The incoming data stream is treated as an array and planar atomize block 88 performs a matrix transformation on the data. Planar atomize block 88 rearranges the incoming data stream provided by external data source 82 based upon entropy coefficients stored in entropy coefficient register 86 which were calculated by entropy analysis block 84. Alternatively, planar atomize block 88 rearranges, the incoming data stream from external data source 82 based upon a predefined relationship. For example, if the incoming data stream represents color images, bits representing various color separations can be grouped together into a single data stream and provided to planar formation block 90. Planar atomize block 88 can perform similar data rearrangements on gray scale images. Additionally, planar atomize block 88 can perform a predefined rearrangement of data which contains data elements which can be logically grouped together. For example, a database having a number of records each of which are formed by a fixed number of data fields can be rearranged so that similar data fields are grouped together. Note that the rearrangement can be at bit, byte, word, or data field level.

Planar atomize block 88 provides header information in the atomize data stream to planar formation block 90. For example, in a preferred embodiment of the present invention, the header comprises:

| PLANAR ATOMIZE HEADER RECORD | | | |
|---|---|---|---|
| DATANAME | TYPE | COMMENTS | SIZE (BYTES) |
| DS_Name | Character | Dataset name of the original dataset. Used to recreate from an atomized set. | 11 |
| ATOM_Name | Character | Name of the dataset of the plane. | 11 |

PLANAR ATOMIZE HEADER RECORD

| DATANAME | TYPE | COMMENTS | SIZE (BYTES) |
|---|---|---|---|
| ATOM_Size | Integer | Number of bits in the plane. | 2 |
| ATOM_Numb | Integer | The number of the plane. | 2 |
| MAX_ATOMS | Integer | The total number of planes. | 2 |
| ORIENT | Integer | The orientation of the plane = DEGREES/90. | 2 |
| FRAMESIZE | Integer | The logical frame size bytes. | 4 |
| ENCRYPT | Logical | Encryption Flag | 2 |
| RESERVED | Character | Reserved | 28 |

Planar formation block 90 rearranges the atomized data stream from planar atomize block 88 into n data planes by placing each data element into its appropriate data plane, Plane 1 register 92 through Plane n register 108. The number of data planes is based upon the entropy analysis performed by entropy analysis block 84 or the number of data elements in the incoming data stream which are known to be related. For example, eight data planes in an 8 bit gray scale image.

Planar combination block 110 combines data from data planes 92 through 108 into a stream of combined planar data which is provided to post combinant compress block 112. For example, data from Planes 1 to n can be provided sequentially beginning from Plane 1 register 92 and continuing through the end of Plane n register 108. The information provided to post combinant compress block 112 from planar combination block 110 includes a map which is stored in header register 109. Typically, the map is provided with the data stream as header information. The map carries information regarding how the rearranged data stream provided by planar combination block 110 relates to the incoming, unprocessed data stream originally provided by external data source 82. If there is a predetermined relationship between the incoming unprocessed data stream and the combined planar data provided by planar combination block 110 (for example, in the case of a gray scale image), then the header information may be unnecessary. For example, the header provided by planar combination block 110 may be of the format:

COMPRESSION HEADER RECORD

| DATANAME | TYPE | COMMENTS | SIZE (BYTES) |
|---|---|---|---|
| DS_Name | Character | Dataset name of the original dataset. Used to recreate from an atomized set. | 11 |
| ATOM_Name | Character | Name of the dataset of the plane. | 11 |
| ATOM_Size | Integer | Number of bits in the plane. | 2 |
| Atom_Numb | Integer | The number of the plane. | 2 |
| MAX_ATOMS | Integer | The total number of planes. | 2 |
| ORIENT | Integer | The orientation of this plane = DEGREES/90. | 2 |
| FRAMESIZE | Integer | The logical frame size in bytes | 4 |
| ENCRYPT | Logical Integer | Encryption Flag | 2 |
| DataType | Integer | Type of data (eg. EBCDIC, DBCS, PCX, ASCII) | 2 |
| BUFFERSIZE | Integer | Size of compression buffer | 4 |
| COMPMODE | Integer | Compression Strategy used | 2 |
| COMPCRC32 | Character | 32 bit CRC | 4 |
| RESERVED | Character | RESERVED | 16 |

Post combinant compress block 112 performs a standard data compression process on the combined planar data and header information provided by planar combination block 110. This compression may be, for example, Lempel-Zev-Welsh, Huffman, or Shannon-Fanno. Compressed data from post combinant compress block 112 is provided to external data source 114.

Data compressed according to system 80 of FIG. 4 may be expanded by a reverse process shown in system 120 of FIG. 5. In the reverse process of system 120, entropy analysis block 84 and entropy coefficient block 86 are not included. In system 120 of FIG. 5, an external data source 122 provides compressed data to a decompression block 124. Decompression block 124 is coupled to a planar formation block 126. Planar formation block 126 is coupled to Plane 1 register 128, Plane 2 register 130, Plane 3 register 132, Plane 4 register 134, Plane 5 register 136, Plane 6 register 138, Plane 7 register 140, Plane 8 register 142, and Plane n register 144. A header register 145 is also connected to planar formation register 126. Registers 128 through 145 are coupled to a planar combination block 146. Planar combination block 146 is connected to planar de-atomize block 148. Planar de-atomize block 148 is coupled to external data destination 150.

In operation of decompression system 120, information is retrieved from external data source 122. Information from external data source 122 is provided to decompression block 124. Decompression block 124 performs the appropriate decompression on the incoming data stream, such as Lempel-Zev-Welsh, Huffman, etc. The decompressed data is provided to planar formation block 126. Planar formation block 126 arranges the decompressed data stream in registers 128 through 144. Header information is placed in header register 145. Planar combination block 146 combines the information from registers 128 through 144 into a data stream which is provided planar de-atomization block 148. Planar de-atomization block 148 "de-atomizes," or rearranges elements of the data stream based on information contained in a header stored in register 145 provided with the uncompressed data stream. Alternatively, if the information is arranged based upon a predefined relationship such as with gray scale or color images, de-atomization block 148 rearranges the data based upon this predefined relationship. The rearranged data is now in its original, unprocessed form and is provided to external data storage device 150.

Entropy analysis block 84 shown in FIG. 4 calculates "entropy" of the incoming data stream. Entropy calculation refers to calculating the level of order of data. The level of order, or the amount of repetition in the data stream, represents the compressibility of the data. This calculation is used to determine how to rearrange the incoming data to improve efficiency of the compression performed by post combinant compress block 112 shown in FIG. 4.

Entropy may be calculated using the following procedure:

```
Assume:  a)  LOG(X) = 3.32 * log10(X)
         b)  ENTROPY(X) = -(X * LOG(X))
1) Build a table of all observations or a
   representative set of observations
   (0 = > x < 256)
2) Accumulate the entropy of the frequency
   of observations, e.g. basis
   for idx = 1 to 255
      if (table (idx))
         Frequency = table (idx)/filesize
         (or NOBS) accum = accum + ENTROPY
         (frequency) endif (* Calculate the
         frequency of an occurrence of a
         character idx relative to
         filesize.*)
      next idx
3) Entropy Result = (100 - (accum * 100)/8)
```

See *Information theory: Symbols, Signals & Noise*; John Pierce; Dover; 1981. This example calculates entropy of a file by tabulating the frequency at which characters in the file occur. This procedure may repeated for different data arrangements and the entropy results compared to determine how to reformat the data to achieve a higher level of organization.

The entropy calculation process is used to calculate entropy of the incoming data after it has been rearranged into a number of different formats. For example, the incoming data can be treated as a matrix and entropy calculated with the matrix inverted, shifted 90°, etc. Entropy analysis block 84 then selects the format which provides the highest level of entropy. This information is provided to entropy coefficient register 86.

Planar atomize block 88 rearranges the data stream. Atomizing is a process of breaking down information into smaller elements, such as bits. "Atomization" may be through the following procedure:

```
Atomize:
   Initialize dataspace
   Acquire planar parameters (rotation,
      plane bit size)
   Identify planar output names
   Establish input correspondence
   Establish output correspondence for all
      planar streams
   Build header record
   Write header record to each planar
      output stream
   While data remains in the input stream
      perform matrix-transform for
         rotation strategy
      bit translate input byte to output
         bitstreams by finding n bits
         from input stream byte(s) and
         outputting to 8/n output
         streams respectively
      end proc
   end while
   Write trailer records to output streams
   Close input stream
   Close output streams
End Atomize
```

In the present invention, information is converted into a number of different data planes much the way color positives, negatives, and separations operate. There need be no regard for the order of information or content. In one embodiment, each data element (i.e. a byte) is reduced to its smallest unit (a bit) and rearranged. Prior to data compression, the information is prepared, or preprocessed, to increase its compressibility. Data preparation includes reducing the information to its smallest element and recombining the elements into a number of separate data planes.

The number of planes may be based upon the data format and its orientation. For example, extended ASCII characters are based upon 8 bits of information. EDCDIC, GIF, TIF, GMF, PCX, and BMP are other examples of data formats. With advancements in video composite display systems, color palettes now support up to 64 million colors. This is accomplished using a variety of encoding techniques ranging from using a single bit per pixel for monochrome display through 256-bit composite images. Composite images use combinations of color and hue to generate extremely accurate color displays.

In the present invention, the planarized information is evaluated using an evaluation process which explores the geometry of the data using quadrant and step-wise entropy and distribution analysis. The geometry which possesses the highest degree of entropy and the distribution with the minimum number of intervals is deemed to be the format which will yield the highest degree of compressibility of the data. Uniform entropy and distributions with a wide range and a high number of intervals with sparse populations are deemed to be likely benefactors of less processor intensive compression strategies such as Lempel-Zev-Welsh, Huffman, or Shannon-Fanno.

Based upon a derived or predefined strategy, the information is reduced to the desired component level ("atomized") and reoriented accordingly. This process may include bit-wise inversions or variations within an acquisition strategy. For example, in a 1×16 byte array, an 8×16 bit array will be constructed and converted to an 8×2 byte array. This conversion can result in a nearly 25% compression. The last word of data can contain appropriate cyclic redundancy checks. A header is recorded which contains all information necessary to reconstruct and verify the data.

Data compression is through an $n^{th}$-order arithmetic compression such as Huffman encoding, run-length encoding, Lempel-Zev-Welsh, or Shannon-Fanno. Any combination of these techniques or other compression methods may be employed.

Compressed data is recomposed using the appropriate decoding scheme (Huffman, Lempel-Zev-Welsh, Shannon-Fanno, etc.). The expanded data is reconstructed and reoriented into its original format based upon information contained in a header.

The present invention includes preprocessing information to increase its compressibility prior to providing the information to a data compression system. The invention increases information compressibility by reformatting the information into a more highly ordered format. Information is organized into a plurality of data planes. Each data plane includes a plurality of data elements (such as bytes, nibbles, or bits) which are organized in two dimensional array. The data planes are disassembled into a combined planar data stream which is more highly ordered than the original, unprocessed data stream. The data can be rearranged based upon a predefined process, such as gray scale or color images. Alternatively, "entropy" of the information can be calculated and used to determine a preferred rearrangement strategy. A header is provided which relates the rearranged data to the original data stream. The invention includes a reverse process in which compressed information is uncompressed and rearranged into its original format. By increasing information compressibility, the present invention is suitable for many uses.

Although the present invention has been described with reference to preferred embodiments, workers skilled in the art will recognize that changes may be made in form and detail without departing from the spirit and scope of the invention.

What is claimed is:

1. An apparatus for expanding compressed information comprising;

means for receiving a data stream of compressed information from an information source;

means for receiving the compressed information data stream and providing a combined planar data and header output;

planar formation means for arranging component elements of the combined planar data and header output into a plurality of data planes;

planar combination means for withdrawing data from the plurality of data planes and providing a planar combination output;

planar de-atomize means for rearranging the planar combination output into de-atomized data stream; and means for outputting the de-atomized data stream.

2. The apparatus of claim 1 wherein the planar de-atomize means rearranges the information based upon a map carried in the combined planar data.

3. The apparatus of claim 1 wherein the plurality of data planes represent color separations.

4. The apparatus of claim 1 wherein the means for receiving the compressed information comprises means for permanently storing the compressed information stream.

5. The apparatus of claim 1 wherein the means for receiving the compressed information comprises a communication link for transferring the compressed information to a physically remote site.

6. The apparatus of claim 1 including means for generating a map which carries information related to a relationship between the combined planar data and said compressed information.

7. The apparatus of claim 1 wherein the plurality of data planes represent a gray scale.

8. A method of expanding compressed information comprising:

receiving a data stream of compressed information from an information source, decompressing the compressed information data stream and providing a combined planar data and header output;

arranging component elements of the combined planar data and header output into a plurality of data planes;

converting the plurality of data planes into a planar combination output which comprises a plurality of data elements;

de-atomizing the data stream by rearranging the plurality of data elements in the planar combination output and providing a rearranged data output; and outputting the rearranged data output.

* * * * *